United States Patent
Tanaka et al.

(10) Patent No.: US 10,243,038 B1
(45) Date of Patent: Mar. 26, 2019

(54) SEMICONDUCTOR DEVICE

(71) Applicant: Kabushiki Kaisha Toshiba, Minato-ku (JP)

(72) Inventors: Katsuhisa Tanaka, Arakawa (JP); Ryosuke Iijima, Setagaya (JP); Shinya Kyogoku, Tsukuba (JP); Shinsuke Harada, Tsukuba (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

(21) Appl. No.: 15/905,932

(22) Filed: Feb. 27, 2018

(30) Foreign Application Priority Data

Nov. 28, 2017 (JP) ................................. 2017-228232

(51) Int. Cl.
*H01L 29/06* (2006.01)
*H01L 29/78* (2006.01)
*H01L 29/739* (2006.01)
*H01L 29/423* (2006.01)
*H01L 29/40* (2006.01)
(Continued)

(52) U.S. Cl.
CPC ........ *H01L 29/063* (2013.01); *H01L 29/1608* (2013.01); *H01L 29/401* (2013.01); *H01L 29/4236* (2013.01); *H01L 29/42368* (2013.01); *H01L 29/7397* (2013.01); *H01L 29/7813* (2013.01); *H01L 21/046* (2013.01); *H01L 21/049* (2013.01)

(58) Field of Classification Search
CPC ............ H01L 29/4236; H01L 29/7397; H01L 29/7813
See application file for complete search history.

(56) References Cited

U.S. PATENT DOCUMENTS 5,915,180 A 6/1999 Hara et al.
6,624,470 B2 9/2003 Fujishima
(Continued)

FOREIGN PATENT DOCUMENTS

JP 2003-051594 2/2003
JP 2003-069042 3/2003
(Continued)

*Primary Examiner* — Dung A. Le
(74) *Attorney, Agent, or Firm* — Oblon, McClelland, Maier & Neustadt, L.L.P.

(57) ABSTRACT

According to one embodiment, a semiconductor device includes a first conductive portion, a semiconductor portion including silicon carbide, and a first insulating portion. The semiconductor portion includes first to fourth semiconductor regions. The first semiconductor region includes first and second partial regions. The third semiconductor region is provided between the second partial region and the second semiconductor region. The fourth semiconductor region is provided between the first conductive portion and the first partial region. The first insulating portion includes first to third portions. A portion of the first portion is positioned between the first conductive portion and the fourth semiconductor region. The second portion is positioned between the second semiconductor region and the portion of the first conductive portion and between the first conductive portion and the third semiconductor region. The third portion is provided between the first and second portions. The third portion has first and second surfaces.

20 Claims, 8 Drawing Sheets

(51) Int. Cl.
　　　*H01L 29/16*　　　(2006.01)
　　　*H01L 21/04*　　　(2006.01)

(56) References Cited

U.S. PATENT DOCUMENTS

| | | |
|---|---|---|
| 2009/0114969 A1 | 5/2009 | Suzuki et al. |
| 2014/0073116 A1 | 3/2014 | Hayashi et al. |
| 2015/0287789 A1 | 10/2015 | Fujiwara et al. |
| 2018/0097079 A1* | 4/2018 | Utsumi ............... H01L 29/1608 |
| 2018/0308975 A1* | 10/2018 | Ohse ................. H01L 29/66068 |

FOREIGN PATENT DOCUMENTS

| | | |
|---|---|---|
| JP | 3471473 | 12/2003 |
| JP | 3985537 | 10/2007 |
| JP | 2010-258329 | 11/2010 |
| JP | 4798119 | 10/2011 |
| JP | 4872217 | 2/2012 |
| JP | 5721868 | 5/2015 |
| JP | 5811973 | 11/2015 |
| JP | 5840296 | 1/2016 |
| JP | 2016-082096 | 5/2016 |

* cited by examiner

# US 10,243,038 B1

SEMICONDUCTOR DEVICE

CROSS-REFERENCE TO RELATED APPLICATIONS

This application is based upon and claims the benefit of priority from Japanese Patent Application No. 2017-228232, filed on Nov. 28, 2017; the entire contents of which are incorporated herein by reference.

FIELD

Embodiments described herein relate generally to a semiconductor device.

BACKGROUND

It is desirable to increase the breakdown voltage of a semiconductor device.

DETAILED DESCRIPTION

Figure 1A:
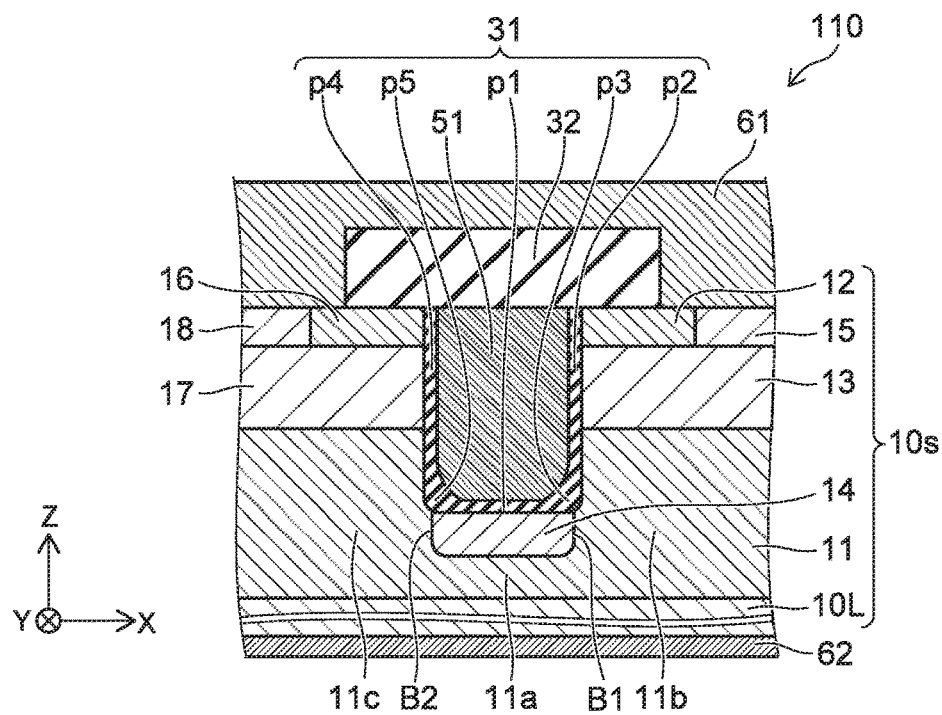
FIG. 1A and FIG. 1B are schematic cross-sectional views illustrating a semiconductor device according to a first embodiment.

According to one embodiment, a semiconductor device includes a first conductive portion, a semiconductor portion including silicon carbide, and a first insulating portion. The semiconductor portion includes first to fourth semiconductor regions. The first semiconductor region is of a first conductivity type, and includes a first partial region and a second partial region. The first partial region is separated from the first conductive portion in a first direction. A direction from the first partial region toward the second partial region crosses the first direction. The second semiconductor region is of the first conductivity type. A direction from a portion of the first conductive portion toward the second semiconductor region is aligned with a second direction crossing the first direction. The third semiconductor region is of a second conductivity type and is provided between the second partial region and the second semiconductor region in the first direction. The fourth semiconductor region is of the second conductivity type and is provided between the first conductive portion and the first partial region in the first direction. A direction from the fourth semiconductor region toward the second partial region is aligned with the second direction. The first insulating portion includes first to third portions. At least a portion of the first portion is positioned between the first conductive portion and the fourth semiconductor region in the first direction. The second portion is positioned between the second semiconductor region and the portion of the first conductive portion in the second direction and between the first conductive portion and the third semiconductor region in the second direction. A portion of the second partial region overlaps the second portion in the first direction. The third portion is provided between the first portion and the second portion. The third portion has a first surface and a second surface. The first surface opposes the first conductive portion. The second surface opposes the semiconductor portion. A first curvature radius of the first surface in a cross section is larger than a second curvature radius of the second surface in the cross section. The cross section includes the first direction and the second direction.

Various embodiments will be described hereinafter with reference to the accompanying drawings.

The drawings are schematic or conceptual; and the relationships between the thicknesses and widths of portions, the proportions of sizes between portions, etc., are not necessarily the same as the actual values thereof. There are also cases where the dimensions and/or the proportions are illustrated differently between the drawings, even in the case where the same portion is illustrated.

In this specification and each drawing, components similar to ones described in reference to an antecedent drawing are marked with the same reference numerals; and a detailed description is omitted as appropriate.

First Embodiment

Figure 1B:
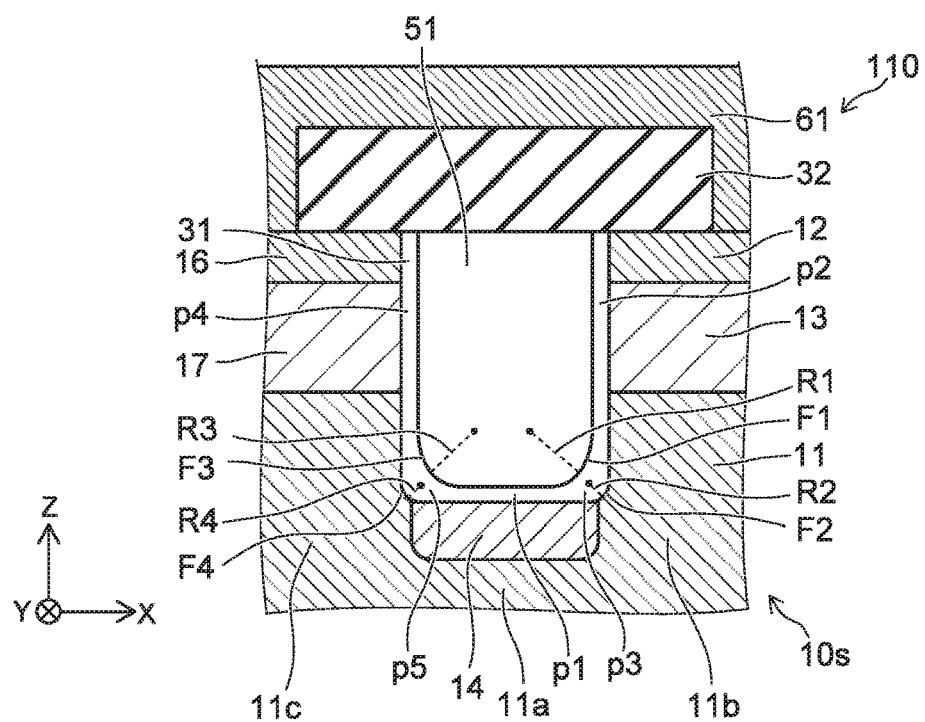

FIG. 1A and FIG. 1B are schematic cross-sectional views illustrating a semiconductor device according to a first embodiment.

As shown in FIG. 1A, the semiconductor device 110 according to the embodiment includes a first conductive portion 51, a semiconductor portion 10s, and a first insulating portion 31. The semiconductor portion 10s includes silicon carbide.

The semiconductor portion 10s includes first to fourth semiconductor regions 11 to 14.

The first semiconductor region 11 and the second semiconductor region 12 are of a first conductivity type. The third semiconductor region 13 and the fourth semiconductor region 14 are of a second conductivity type.

For example, the first conductivity type is an n-type; and the second conductivity type is a p-type. The first conductivity type may be the p-type; and the second conductivity type may be the n-type. In the following example, the first conductivity type is the n-type; and the second conductivity type is the p-type.

The n-type impurity includes, for example, at least one selected from the group consisting of N, P, and As. The p-type impurity includes, for example, at least one selected from the group consisting of B, Al, and Ga.

The first semiconductor region 11 includes a first partial region 11a and a second partial region 11b. The first partial region 11a is separated from the first conductive portion 51 in a first direction.

The first direction is taken as a Z-axis direction. One direction perpendicular to the Z-axis direction is taken as an X-axis direction. A direction perpendicular to the Z-axis direction and the X-axis direction is taken as a Y-axis direction.

The direction from the first partial region 11a toward the second partial region 11b crosses the first direction (the Z-axis direction).

The direction from a portion of the first conductive portion 51 toward the second semiconductor region 12 is aligned with the second direction. The second direction crosses the first direction (the Z-axis direction). The second direction is, for example, the X-axis direction.

The third semiconductor region 13 is provided between the second partial region 11b and the second semiconductor region 12 in the first direction (the Z-axis direction).

The fourth semiconductor region 14 is provided between the first conductive portion 51 and the first partial region 11a in the first direction (the Z-axis direction).

The direction from the fourth semiconductor region 14 toward the second partial region 11b is aligned with the second direction (e.g., the X-axis direction).

The first insulating portion 31 includes first to third portions p1 to p3. At least a portion of the first portion p1 is positioned between the first conductive portion 51 and the fourth semiconductor region 14 in the first direction (the Z-axis direction). The second portion p2 is positioned between the second semiconductor region 12 and the portion of the first conductive portion 51 recited above in the second direction (the X-axis direction) and between the first conductive portion 51 and the third semiconductor region 13 in the second direction. The third portion p3 is provided between the first portion p1 and the second portion p2.

For example, the fourth semiconductor region 14 is provided on the first partial region 11a. The first portion p1 of the first insulating portion 31 is positioned on the fourth semiconductor region 14. The first conductive portion 51 is positioned on the first portion p1. The second partial region 11b is provided at the side of the fourth semiconductor region 14. In the example, a portion of the second partial region 11b is positioned at the side of the first partial region 11a. The third semiconductor region 13 is provided on the second partial region 11b. The second semiconductor region 12 is provided on the third semiconductor region 13.

As shown in FIG. 1A, a first electrode 61, a second electrode 62, and a second insulating portion 32 are further provided in the example.

The first electrode 61 is electrically connected to the second semiconductor region 12. For example, the second semiconductor region 12 is positioned between the third semiconductor region 13 and at least a portion of the first electrode 61 in the first direction (the Z-axis direction).

The first electrode 61 extends above the first conductive portion 51. The second insulating portion 32 is positioned between the first conductive portion 51 and another portion of the first electrode 61 in the first direction (the Z-axis direction). The second insulating portion 32 electrically insulates the first conductive portion 51 and the first electrode 61.

The second electrode 62 is provided below the first semiconductor region 11. For example, the first partial region 11a is positioned between the fourth semiconductor region 14 and the second electrode 62 in the first direction (the Z-axis direction). The second partial region 11b is positioned between the third semiconductor region 13 and the second electrode 62 in the first direction.

The semiconductor device 110 is, for example, a transistor. The first conductive portion 51 functions as, for example, a gate electrode. The first electrode 61 functions as, for example, a source electrode. The second electrode 62 functions as, for example, a drain electrode. The first insulating portion 31 functions as, for example, a gate insulating film. The second insulating portion 32 functions as, for example, an inter-layer insulating film.

The first semiconductor region 11 functions as, for example, a drift region. For example, the region that includes the second semiconductor region 12 and the third semiconductor region 13 functions as a channel region. The second semiconductor region 12 functions as a contact region to the first electrode 61. The semiconductor device 110 is, for example, a trench transistor.

In the example, the semiconductor portion 10s further includes a semiconductor layer 10L. The semiconductor layer 10L is positioned between the first semiconductor region 11 and the second electrode 62. The semiconductor layer 10L is of the first conductivity type or the second conductivity type. In the case where the semiconductor layer 10L is of the first conductivity type, the semiconductor device 110 functions as a MOS transistor. In the case where the semiconductor layer 10L is of the second conductivity type, the semiconductor device 110 functions as an IGBT (Insulated Gate Bipolar Transistor).

The first conductive portion 51 overlaps the first semiconductor region 11 in the second direction (the X-axis direction). For example, a portion of the second portion p2 of the first insulating portion 31 is positioned between the first conductive portion 51 and the second partial region 11b in the second direction (the X-axis direction). For example, the lower end of the first conductive portion 51 is positioned lower than the lower end of the third semiconductor region 13.

For example, the impurity concentration of the second conductivity type in the fourth semiconductor region 14 is higher than the impurity concentration of the second conductivity type in the third semiconductor region 13. For example, the impurity concentration of the second conductivity type in the fourth semiconductor region 14 is not less than $5 \times 10^{17}$ cm$^{-3}$ and not more than $1 \times 10^{20}$ cm$^{-3}$. For example, the impurity concentration of the second conductivity type in the third semiconductor region 13 is not less than $1 \times 10^{16}$ cm$^{-3}$ and not more than $1 \times 10^{18}$ cm$^{-3}$. For example, the impurity concentration of the first conductivity type in the second semiconductor region 12 is higher than the impurity concentration of the first conductivity type in the first semiconductor region 11.

For example, the first portion p1 is the bottom portion of the first insulating portion 31. The second portion p2 is a side portion. The third portion p3 is a corner portion between the first portion p1 and the second portion p2.

In the embodiment, electric field concentration is relaxed below the first conductive portion 51 (e.g., the gate) by providing the fourth semiconductor region 14 (e.g., the p-type region) below the first conductive portion 51 (e.g., the gate). Thereby, the breakdown voltage can be increased. For example, the degradation of the first portion p1 (the bottom portion) of the first insulating portion 31 is suppressed.

In the embodiment, a portion of the second partial region 11b of the first semiconductor region 11 overlaps the second portion p2 in the first direction (the Z-axis direction). For example, the X-axis direction end of the fourth semiconductor region 14 (a boundary B1 between the fourth semiconductor region 14 and the second partial region 11b) is recessed more to the inside than the outer surface of the side portion (the second portion p2) of the first insulating portion 31.

There is a first reference example in which the width in the X-axis direction of the fourth semiconductor region 14 is large. In the first reference example, the position along the X-axis direction of the boundary B1 between the fourth semiconductor region 14 and the second partial region 11b matches the position along the X-axis direction of the outer surface of the side portion (the second portion p2) of the first insulating portion 31. In such a case, the second partial region 11b does not overlap the second portion p2 in the first direction (the Z-axis direction). In such a first reference example, the carriers that flow through the channel contact the fourth semiconductor region 14. In such a case, the desired characteristics are not obtained easily. For example, there are cases where the on-resistance is high.

Conversely, in the embodiment, a portion of the second partial region 11b of the first semiconductor region 11 overlaps the second portion p2 in the first direction (the Z-axis direction). Thereby, negative effects on the current path are suppressed. For example, the desired characteristics are easier to obtain. For example, the breakdown voltage can be increased while maintaining a low on-resistance.

As shown in FIG. 1A, the curvature of the surface on the inside is smaller than the curvature of the surface on the outside for the third portion p3 (the corner portion) of the first insulating portion 31. Thereby, the electric field concentration at the corner portion is relaxed.

Thus, in the embodiment, the electric field concentration at the bottom portion (the first portion p1) is relaxed by the fourth semiconductor region 14. The negative effects on the current path are suppressed by setting the end (e.g., the boundary B1) in the X-axis direction of the fourth semiconductor region 14 to be recessed more to the inside than the outer surface of the side portion (the second portion p2) of the first insulating portion 31. The electric field concentration at the corner portion is relaxed by the appropriate curvature at the third portion p3 (the corner portion). Thereby, the breakdown voltage can be increased.

As shown in FIG. 1A, the semiconductor portion 10s may further include fifth to eighth semiconductor regions 15 to 18. The first semiconductor region 11 may further include a third partial region 11c. The first insulating portion 31 may further include a fourth portion p4 and a fifth portion p5.

The fourth semiconductor region 14 is positioned between the third partial region 11c and the second partial region 11b in the second direction (the X-axis direction).

The sixth semiconductor region 16 is of the first conductivity type. The first conductive portion 51 is positioned between the sixth semiconductor region 16 and the second semiconductor region 12 in the second direction (the X-axis direction).

The seventh semiconductor region 17 is of the second conductivity type. The first conductive portion 51 is positioned between the seventh semiconductor region 17 and the third semiconductor region 13 in the second direction (the X-axis direction). The seventh semiconductor region 17 is positioned between the third partial region 11c and the sixth semiconductor region 16 in the first direction (the Z-axis direction).

The eighth semiconductor region 18 is of the second conductivity type. The sixth semiconductor region 16 is positioned between the first conductive portion 51 and the eighth semiconductor region 18 in the second direction. The first electrode 61 is electrically connected to the eighth semiconductor region 18.

The fifth semiconductor region 15 is of the second conductivity type. The second semiconductor region 12 is positioned between the fifth semiconductor region 15 and the portion of the first conductive portion 51 recited above in the second direction (the X-axis direction). The first electrode 61 is electrically connected to the fifth semiconductor region 15.

The fourth portion p4 of the first insulating portion 31 is positioned between the first conductive portion 51 and the sixth semiconductor region 16 in the second direction (the X-axis direction) and between the first conductive portion 51 and the seventh semiconductor region 17 in the second direction. The fifth portion p5 is provided between the first portion p1 and the fourth portion p4. The fourth portion p4 is another one of the multiple side portions. The fifth portion p5 is a corner portion between the first portion p1 and the fourth portion p4.

For example, a portion of the third partial region 11c of the first semiconductor region 11 overlaps the fourth portion p4 in the first direction (the Z-axis direction). For example, another X-axis direction end of the fourth semiconductor region 14 (a boundary B2 between the fourth semiconductor region 14 and the third partial region 11c) is recessed more to the inside than the outer surface of the side portion (the fourth portion p4) of the first insulating portion 31. Thereby, the negative effects on the current path are suppressed.

For example, as shown in FIG. 1A, the curvature of the surface on the inside is smaller than the curvature of the surface on the outside at the fifth portion p5 (the corner portion) of the first insulating portion 31. Thereby, the electric field concentration at the corner portion is relaxed.

The curvature (or the curvature radius) of the corner portion will now be described. The curvature is the reciprocal of the curvature radius.

As shown in FIG. 1B, the third portion p3 of the first insulating portion 31 has a first surface F1 and a second surface F2. The first surface F1 opposes the first conductive portion 51. The second surface F2 opposes the semiconductor portion 10s (e.g., the first semiconductor region 11). The first surface F1 is, for example, the surface on the inside. The second surface F2 is, for example, the surface on the outside.

The first surface F1 has a first curvature radius R1. The first curvature radius R1 is the curvature radius of the first surface F1 in a cross section (a cross section aligned with the X-Z plane) including the first direction and the second direction. The second surface F2 has a second curvature radius R2. The second curvature radius R2 is the curvature radius of the second surface F2 in the cross section recited above. In the embodiment, the first curvature radius R1 is larger than the second curvature radius R2. Thereby, the electric field concentration at the corner portion (the third portion p3) is relaxed.

The fifth portion p5 (another corner portion) of the first insulating portion 31 has a third surface F3 and a fourth surface F4. The third surface F3 opposes the first conductive portion 51. The fourth surface F4 opposes the semiconductor portion 10s (e.g., the first semiconductor region 11). A third curvature radius R3 of the third surface F3 in the cross section recited above is larger than a fourth curvature radius R4 of the fourth surface F4 in the cross section recited above. Thereby, the electric field concentration at the corner portion (the fifth portion p5) is relaxed.

For example, the first curvature radius R1 is not less than 4 times and not more than 10 times the second curvature radius R2. By setting the first curvature radius R1 to be not less than 4 times the second curvature radius R2, for example, the electric field at the corner portion of the first insulating portion 31 is relaxed. By setting the first curvature radius R1 to be not more than 10 times the second curvature radius R2, for example, a stable configuration of the corner portion of the first insulating portion 31 is obtained easily.

An example of the first insulating portion 31 will now be described.

Figure 2:
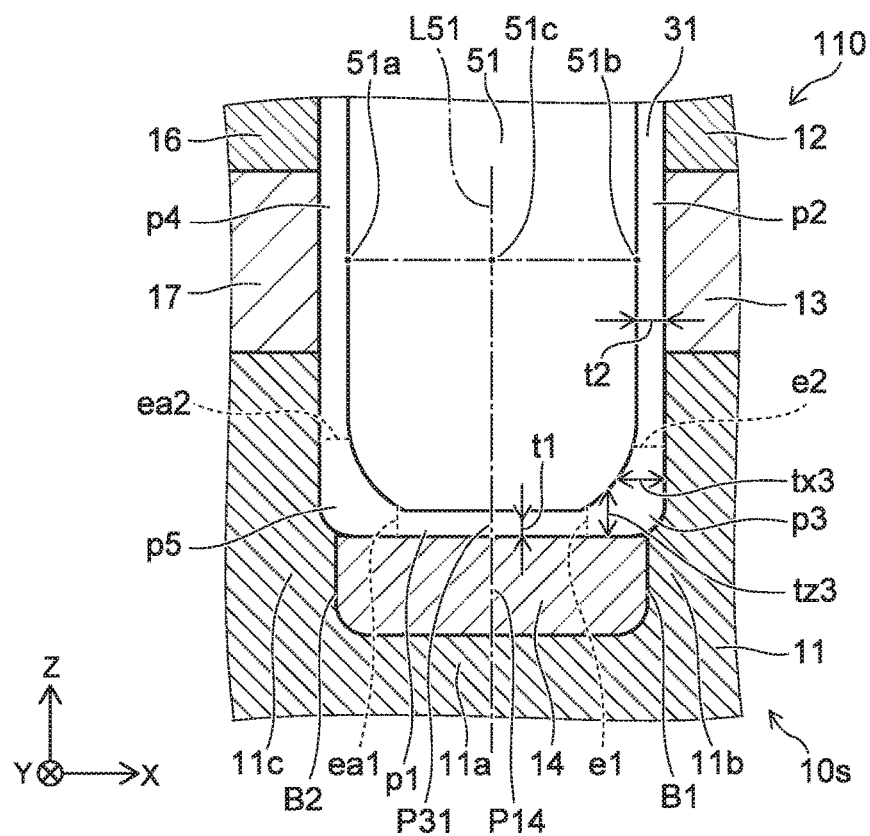
FIG. 2 is a schematic cross-sectional view illustrating the semiconductor device according to the first embodiment.

FIG. 2 is a schematic cross-sectional view illustrating the semiconductor device according to the first embodiment.

The first conductive portion 51 has two ends (an end 51a and an end 51b) in the second direction (the X-axis direction). A straight line along the first direction (the Z-axis direction) that passes through a midpoint 51c between these two ends (the end 51a and the end 51b) is taken as a straight line L51. The straight line L51 passes through one position P31 (a second position) of the first portion p1. The length along the first direction (the Z-axis direction) of the first portion p1 at this position P31 (the second position) is taken as a first length t1.

There are cases where the thickness (the length along the first direction) of the first insulating portion 31 changes continuously in a region including the first portion p1 and the third portion p3. In such a case, the portion where the length (the thickness) along the first direction is 1.1 times the first length t1 or less can be considered to be the first portion p1 for convenience. The portion where the length (the thickness) along the first direction exceeds 1.1 times the first length t1 can be considered to be the third portion p3 for convenience. Even in the case where the portion having the length that is 1.1 times the first length t1 or less is considered to be the first portion p1 for convenience, the first length t1 is used as the thickness of the first portion p1.

On the other hand, the thickness (the length along the second direction (the X-axis direction)) of the first insulating portion 31 is substantially constant at the portion of the first insulating portion 31 opposing the third semiconductor region 13. The length (the thickness) along the second direction (the X-axis direction) of the portion of the first insulating portion 31 opposing the third semiconductor region 13 is taken as a second length t2. The second length t2 corresponds to the length (the thickness) along the second direction (the X-axis direction) of the second portion p2.

There are cases where the thickness (the length along the second direction) of the first insulating portion 31 changes continuously in a region including the second portion p2 and the third portion p3. In such a case, the portion where the length (the thickness) along the second direction is 1.1 times the second length t2 or less can be considered to be the second portion p2 for convenience. The portion where the length (the thickness) along the second direction exceeds 1.1 times the second length t2 can be considered to be the third portion p3 for convenience. Even in the case where the portion having the length that is 1.1 times the second length t2 or less is considered to be the second portion p2 for convenience, the second length t2 is used as the thickness of the second portion p2.

A length tz3 along the first direction (the Z-axis direction) of the third portion p3 is longer than the length (the first length t1) along the first direction of the first portion p1. The length tz3 exceeds 1.1 times the first length t1. A length tx3 along the second direction (the X-axis direction) of the third portion p3 is longer than the length (the second length t2) along the second direction of the second portion p2. The length tx3 exceeds 1.1 times the second length t2.

The first portion p1 of the first insulating portion 31 has a first end portion e1. The first end portion e1 is continuous with the third portion p3. The length along the first direction (the Z-axis direction) of the first end portion e1 is 1.1 times the first length t1 (the length along the first direction (the Z-axis direction) of the first portion p1 at the position P31 (the second position) recited above). The first portion p1 has another end portion ea1. The other end portion ea1 is continuous with the fifth portion p5. The length along the first direction (the Z-axis direction) of the other end portion ea1 is 1.1 times the first length t1.

The second portion p2 of the first insulating portion 31 has a second end portion e2. The second end portion e2 is continuous with the third portion p3. The length along the second direction (the X-axis direction) of the second end portion e2 is 1.1 times the second length t2. The fourth portion p4 has an end portion ea2. The end portion ea2 is continuous with the fifth portion p5. The length along the second direction (the X-axis direction) of the end portion ea2 is 1.1 times the second length t2.

Even in the case where the first to fifth portions p1 to p5 are thus defined, the first curvature radius R1 is larger than the second curvature radius R2 at the third portion p3 (referring to FIG. 1B). As shown in FIG. 1B, the third curvature radius R3 is larger than the fourth curvature radius R4 at the fifth portion p5 (referring to FIG. 1B).

In the embodiment as described above, a portion of the second partial region 11b of the first semiconductor region 11 overlaps the second portion p2 in the first direction (the Z-axis direction). A portion of the third partial region 11c of the first semiconductor region 11 overlaps the fourth portion p4 in the first direction (the Z-axis direction). In the example shown in FIG. 2, a portion of the fourth semiconductor region 14 overlaps the second portion p2 in the first direction (the Z-axis direction). Another portion of the fourth semiconductor region 14 overlaps the fourth portion p4 in the first direction. In such a case, the boundary B1 between the fourth semiconductor region 14 and the second partial region 11b overlaps the second portion p2 in the first direction. The boundary B2 between the fourth semiconductor region 14 and the third partial region 11c overlaps the fourth portion p4 in the first direction.

The information that relates to the boundary B1 and the boundary B2 is obtained by, for example, SCM (Scanning Capacitance Microscopy), etc. The information that relates to the boundary B1 and the boundary B2 is obtained by, for example, SMM (Scanning Microwave Microscopy), etc.

Examples of these boundaries will now be described.

As recited above, the first conductive portion 51 has the two ends (the end 51a and the end 51b) in the second direction (the X-axis direction) (referring to FIG. 2). The straight line L51 along the first direction (the Z-axis direction) that passes through the midpoint 51c between these two ends passes through a position P14 (a first position) of the fourth semiconductor region 14.

The impurity concentration of the second conductivity type in a region including the fourth semiconductor region 14 and the second partial region 11b decreases along the direction from the fourth semiconductor region 14 toward the second partial region 11b. The impurity concentration of the second conductivity type at the boundary B1 between the fourth semiconductor region 14 and the second partial region 11b is, for example, 1/100 of the impurity concentration of the second conductivity type at the position P14 (the first position) recited above. In other words, the position where the impurity concentration is 1/100 of the impurity concentration of the second conductivity type at the position (the position P14) at the center of the fourth semiconductor region 14 may be taken as the boundary B1. The position P14 is, for example, substantially the center in the X-axis direction of the fourth semiconductor region 14. The position P14 is, for example, substantially the center in the Z-axis direction of the fourth semiconductor region 14.

The impurity concentration of the second conductivity type in a region including the fourth semiconductor region 14 and the third partial region 11c decreases along the direction from the fourth semiconductor region 14 toward the third partial region 11c. The impurity concentration of the second conductivity type at the boundary B2 may be, for example, 1/100 of the impurity concentration of the second conductivity type at the position P14 (the first position) recited above.

Examples of characteristics of the semiconductor device will now be described. An example of simulation results of a semiconductor device having the model structure illustrated in FIG. 3 will now be described.

Figure 3:
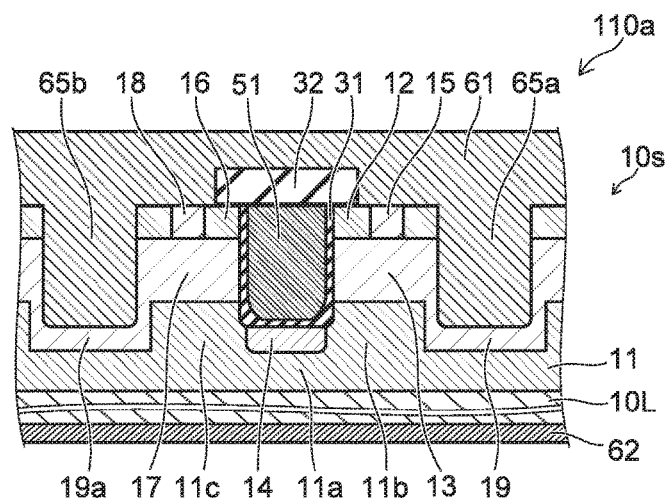
FIG. 3 is a schematic cross-sectional view illustrating another semiconductor device according to the first embodiment.

FIG. 3 is a schematic cross-sectional view illustrating another semiconductor device according to the first embodiment.

As shown in FIG. 3, the semiconductor device 110a includes conductive regions 65a and 65b in addition to the first conductive portion 51, the first electrode 61, the second electrode 62, the semiconductor portion 10s, the first insulating portion 31, and the second insulating portion 32. In this case as well, the semiconductor portion 10s includes silicon carbide. The semiconductor portion 10s further includes a ninth semiconductor region 19 and a semiconductor region 19a in addition to the first to eighth semiconductor regions 11 to 18 recited above.

For example, the conductive region 65a and the conductive region 65b are electrically connected to the first electrode 61. For example, the conductive region 65a and the conductive region 65b may be continuous with the first electrode 61. For example, the conductive region 65a and the conductive region 65b are electrically connected to the second semiconductor region 12. The first conductive portion 51 is positioned between the conductive region 65a and the conductive region 65b in the second direction (the X-axis direction). The second semiconductor region 12 and the third semiconductor region 13 are positioned between the conductive region 65a and the first conductive portion 51 in the X-axis direction. The sixth semiconductor region 16 and the seventh semiconductor region 17 are positioned between the conductive region 65b and the first conductive portion 51 in the X-axis direction. The fifth semiconductor region 15 is positioned between the second semiconductor region 12 and the conductive region 65a in the X-axis direction. The eighth semiconductor region 18 is positioned between the sixth semiconductor region 16 and the conductive region 65b in the X-axis direction.

The ninth semiconductor region 19 and the semiconductor region 19a are of the second conductivity type. The conductive region 65a is electrically connected to the ninth semiconductor region 19. The conductive region 65b is electrically connected to the semiconductor region 19a.

The second partial region 11b is positioned between the fourth semiconductor region 14 and the ninth semiconductor region 19 in the second direction (the X-axis direction). The third partial region 11c is positioned between the fourth semiconductor region 14 and the semiconductor region 19a in the second direction (the X-axis direction). The ninth semiconductor region 19 is positioned between the conductive region 65a and the first semiconductor region 11 in the first direction (the Z-axis direction). The semiconductor region 19a is positioned between the conductive region 65b and the first semiconductor region 11 in the first direction. For example, the ninth semiconductor region 19 is continuous with the third semiconductor region 13. For example, the semiconductor region 19a is continuous with the seventh semiconductor region 17. For example, the impurity concentration of the second conductivity type in the ninth semiconductor region 19 may be higher than the impurity concentration of the second conductivity type in the third semiconductor region 13. For example, the impurity concentration of the second conductivity type in the semiconductor region 19a is substantially the same as the impurity concentration of the second conductivity type in the ninth semiconductor region 19.

Simulation results of the characteristics when modifying the curvature of the corner portion of the first insulating portion 31 for such a semiconductor device 110a will now be described. In the simulation, the second curvature radius R2 (referring to FIG. 1B) is set to be 0.04 μm and is constant. The first curvature radius R1 (referring to FIG. 1B) is modified in the range of 0.1 μm to 0.37 μm. In the model of the simulation, the effective impurity concentration of the second conductivity type (the difference between the impurity concentration of the second conductivity type and the impurity concentration of the first conductivity type) in the fourth semiconductor region 14 is $5.0 \times 10^{18}$ cm$^{-3}$. The difference (the length along the X-axis direction) between the position along the X-axis direction of the boundary B1 between the fourth semiconductor region 14 and the second partial region 11b and the position along the X-axis direction of the surface of the second portion p2 on the outside is 0.12 μm. The thickness (the first length t1) of the first portion p1 is 0.08 μm. The thickness (the second length t2) of the second portion p2 is 0.08 μm. The relative dielectric constant of the first insulating portion 31 is 3.9.

Figure 4:
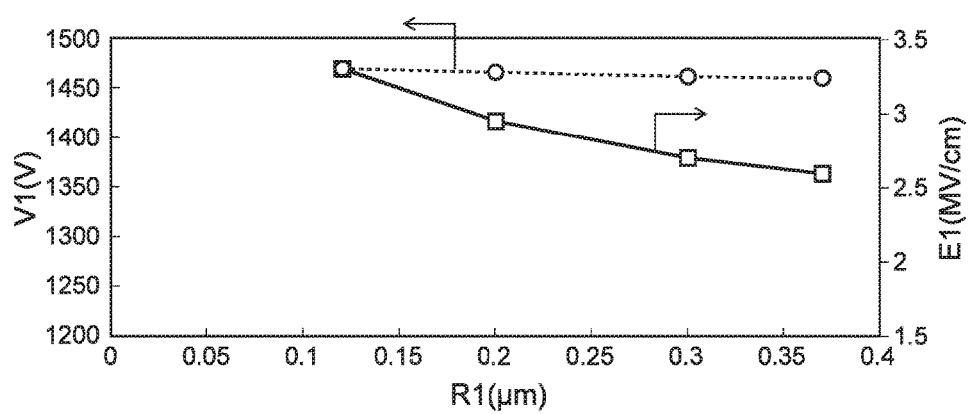
FIG. 4 is a graph illustrating characteristics of the semiconductor device.

FIG. 4 is a graph illustrating characteristics of the semiconductor device.

The horizontal axis of FIG. 4 is the first curvature radius R1 (μm). The vertical axis on the left of FIG. 4 is a breakdown voltage V1 (V). The breakdown voltage V1 is the voltage when the potentials of the source (the first electrode 61) and the gate (the first conductive portion 51) are set to 0 volts (V), and the current flowing between the source-drain exceeds 1 μA when changing the voltage applied to the drain (the second electrode 62). The breakdown voltage V1 corresponds to the breakdown voltage of the off-state. The vertical axis on the right of FIG. 4 is a maximum electric field intensity E1 (MV/cm). The maximum electric field intensity E1 is the maximum value of the electric field applied to the first insulating portion 31 when the voltage applied to the drain electrode (the second electrode 62) is 1200 V.

As shown in FIG. 4, the maximum electric field intensity E1 decreases as the first curvature radius R1 increases. The maximum electric field intensity E1 occurs at the third portion p3. The electric field concentration at the corner portion (the third portion p3) is suppressed by setting the first curvature radius R1 to be larger than the second curvature radius R2. As a result, the maximum electric field intensity E1 decreases. On the other hand, the breakdown voltage V1 substantially does not change. By providing the fourth semiconductor region 14 and by setting the first curvature radius R1 to be larger than the second curvature radius R2, the maximum electric field intensity E1 can be reduced while maintaining a high breakdown voltage V1.

Figure 5:
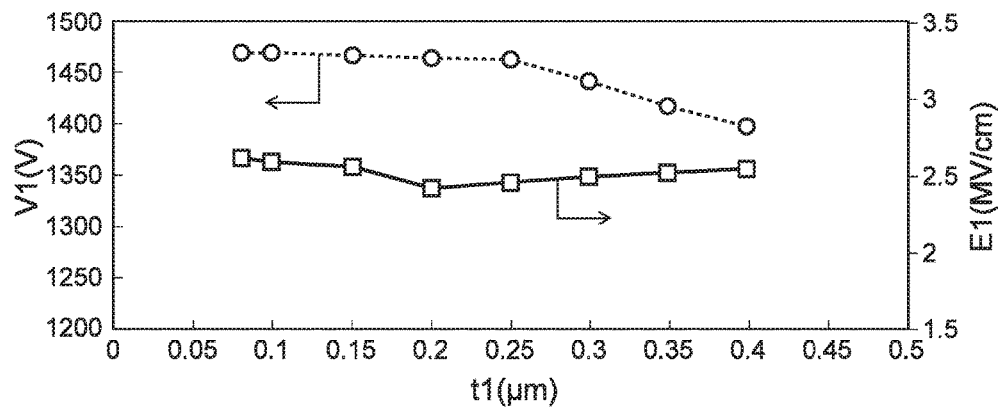
FIG. 5 is a graph illustrating characteristics of the semiconductor device.

FIG. 5 is a graph illustrating characteristics of the semiconductor device.

The horizontal axis of FIG. 5 is the thickness (the first length t1 (μm)) of the first portion p1. The vertical axis on the left of FIG. 5 is the breakdown voltage V1 (V). The vertical axis on the right of FIG. 5 is the maximum electric field intensity E1 (MV/cm). In the example shown in FIG. 5, the thickness (the second length t2) of the second portion p2 is 0.08 μm and is constant. The first curvature radius R1 is 0.04 μm and is constant. The second curvature radius R2 is 0.37 μm and is constant.

As shown in FIG. 5, the breakdown voltage V1 is substantially constant where the first length t1 is 0.25 μm or more. In the range in which the first length t1 is 0.30 μm or more, the breakdown voltage V1 decreases as the first length t1 lengthens.

On the other hand, in the range in which the first length t1 exceeds 0.25 μm, there is a trend of the maximum electric field intensity E1 increasing as the first length t1 lengthens. In the range in which the first length t1 is 0.25 μm or less, the maximum electric field intensity E1 decreases as the first length t1 lengthens.

Generally, it is considered that increasing the thickness of the bottom portion (the first portion p1) of the first insulating portion 31 causes the breakdown voltage V1 to increase; and the maximum electric field intensity E1 can be suppressed. In the embodiment, the electric field concentration at the bottom portion can be suppressed by providing the fourth semiconductor region 14. Therefore, even in the case where the bottom portion (the first portion p1) of the first insulating portion 31 is thin, a high breakdown voltage V1 is obtained; and a low maximum electric field intensity E1 is obtained.

In the embodiment, for example, the length (the first length t1) along the first direction (the Z-axis direction) of the first portion p1 is 0.25 μm or less. For example, the length (the first length t1) along the first direction of the first portion p1 is not more than 3 times the length (the second length t2) along the second direction (the X-axis direction) of the second portion p2. For example, the first length t1 may be the second length t2 or less. A high breakdown voltage V1 is obtained. A low maximum electric field intensity E1 is obtained.

An example of simulation results relating to the relationship between the characteristics and the boundary B1 between the fourth semiconductor region 14 and the second partial region 11b will now be described. The model of FIG. 6 recited below and FIG. 3 described above are employed in the simulation.

Figure 6:
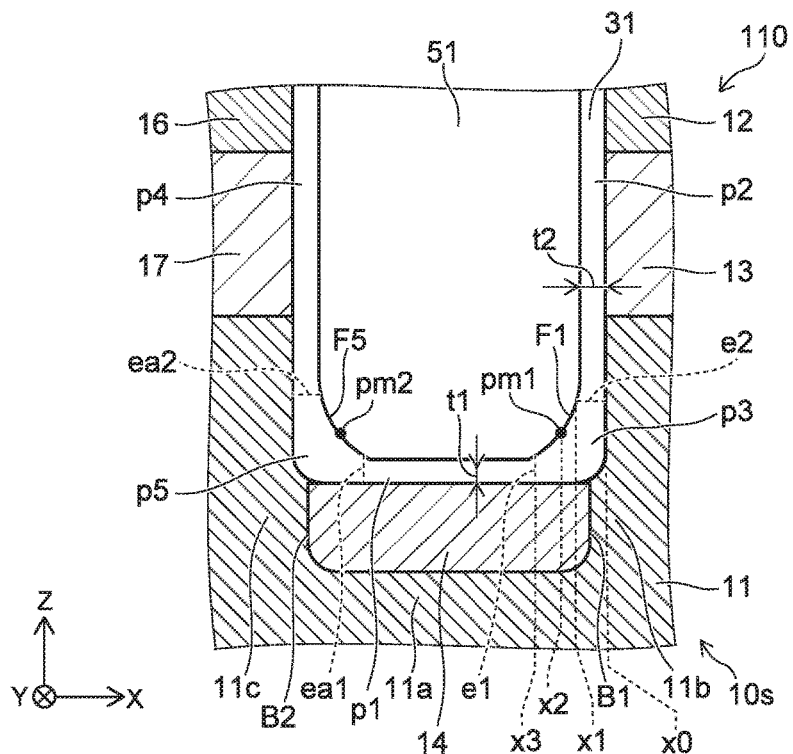
FIG. 6 is a schematic cross-sectional view illustrating the semiconductor device.

FIG. 6 is a schematic cross-sectional view illustrating the semiconductor device.

FIG. 6 shows parameters of the model of the simulation. In the simulation model, the parameters are set as follows.

The width of the trench (the distance along the X-axis direction between the boundary between the second portion p2 and the third semiconductor region 13 and the boundary between the fourth portion p4 and the seventh semiconductor region 17) is 0.8 μm. The thickness of the second portion p2 (the second length t2, i.e., the distance along the X-axis direction between the boundary between the second portion p2 and the third semiconductor region 13 and the boundary between the second portion p2 and the first conductive portion 51) is 0.08 μm. The thickness of the fourth portion p4 (the distance along the X-axis direction between the boundary between the fourth portion p4 and the seventh semiconductor region 17 and the boundary between the fourth portion p4 and the first conductive portion 51) is 0.08 μm. The distance along the X-axis direction between the first end portion e1 and the other end portion ea1 recited above is 0.3 μm.

The thickness of the third portion p3 along a direction perpendicular to the first surface F1 (the inner side surface) of the third portion p3 changes and is dependent on the position along the first surface F1. The first surface F1 of the third portion p3 has a point pm1 (a position). The thickness of the third portion p3 along the direction perpendicular to the first surface F1 is a maximum at the point pm1.

The thickness of the fifth portion p5 along a direction perpendicular to the third surface F3 (the inner side surface) of the fifth portion p5 changes and is dependent on the position along the third surface F3. The third surface F3 of the fifth portion p5 has a point pm2 (a position). The thickness of the fifth portion p5 along the direction perpendicular to the third surface F3 is a maximum at the point pm2. The distance along the X-axis direction between the point pm1 and the point pm2 is 0.5 μm.

As shown in FIG. 6, the position in the X-axis direction (the second direction) of the boundary between the second portion p2 and the third semiconductor region 13 is taken as a reference position x0. The position in the X-axis direction of the boundary between the second portion p2 and the first conductive portion 51 is taken as a position x1. The position in the X-axis direction of the point pm1 is taken as a position x2. The position in the X-axis direction of the first end portion e1 is taken as a position x3. The position x1 is −0.08 μm. The position x2 is −0.15 μm. The position x3 is −0.25 μm.

The characteristics of such a model when changing the position in the X-axis direction of the boundary B1 between the fourth semiconductor region 14 and the second partial region 11b are derived by simulation.

Figure 7:
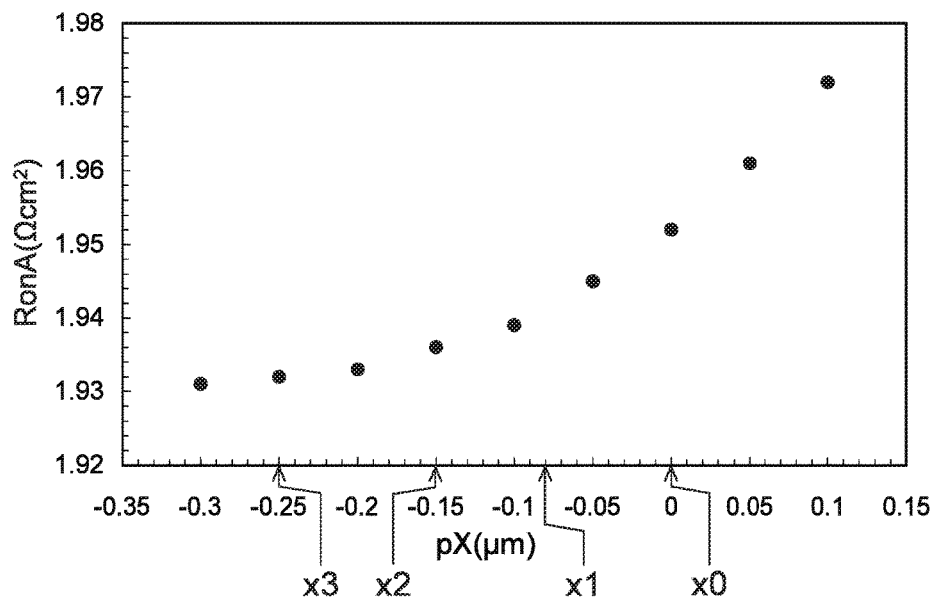
FIG. 7 is a graph illustrating a characteristic of the semiconductor device.

FIG. 7 is a graph illustrating a characteristic of the semiconductor device.

The horizontal axis of FIG. 7 is a relative distance pX (μm) of the boundary B1 with respect to the reference position x0. When the relative distance pX is 0, the boundary B1 is positioned at the reference position x0. A positive relative distance pX corresponds to a state in which the boundary B1 is outside the reference position x0 (does not overlap the trench). A negative relative distance pX corresponds to a state in which the boundary B1 is inside the reference position x0 (overlaps the trench). The reference position x0 and the positions x1 to x3 recited above are shown in FIG. 7. The vertical axis of FIG. 7 is an on-resistance RonA.

As shown in FIG. 7, the on-resistance RonA increases when the relative distance pX is positive and increasing. The on-resistance RonA decreases when the relative distance pX is negative and the absolute value of the relative distance pX increases.

In the embodiment, it is favorable for the relative distance pX to be negative. Thereby, a low on-resistance RonA is obtained.

Figure 8:
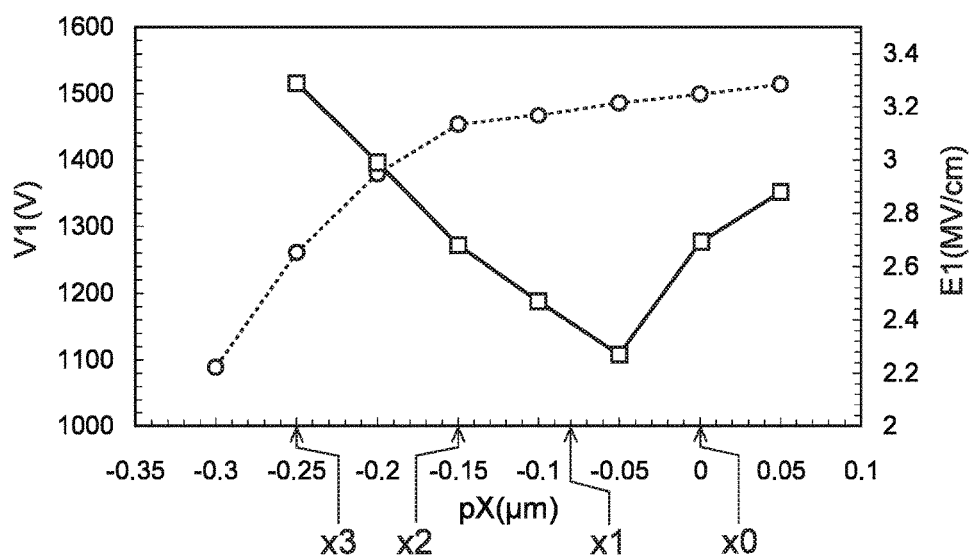
FIG. 8 is a graph illustrating characteristics of the semiconductor device.

FIG. 8 is a graph illustrating characteristics of the semiconductor device.

The horizontal axis of FIG. 8 is the relative distance pX (μm). The vertical axis on the left of FIG. 4 is the breakdown voltage V1 (V). The vertical axis on the right of FIG. 8 is the maximum electric field intensity E1 (MV/cm).

As shown in FIG. 8, the breakdown voltage V1 increases when the relative distance pX is positive and increasing. The breakdown voltage V1 decreases when the relative distance pX is negative and the absolute value of the relative distance pX is increasing.

On the other hand, the maximum electric field intensity E1 has a minimum when the relative distance pX is about −0.05 μm. This position corresponds to the vicinity of the first position x1 or the second position x2.

When the relative distance pX is negative, it is favorable for the absolute value of the relative distance pX not to greatly exceed the position x3. Thereby, a high breakdown voltage V1 and a low maximum electric field intensity E1 are obtained.

From FIG. 7 and FIG. 8, it is favorable for the relative distance pX to be negative. Thereby, a low on-resistance RonA is obtained. It is favorable for the relative distance pX to be negative and the absolute value of the relative distance pX to be not more than a value corresponding to the position x3. A high breakdown voltage V1 and a low maximum electric field intensity E1 are obtained. Further, it is favorable for the relative distance pX to be negative and the absolute value of the relative distance pX to be less than a value corresponding to the position x3. Further, it is favorable for the relative distance pX to be negative and the absolute value of the relative distance pX to be not more than a value corresponding to the position x2.

Figure 9:
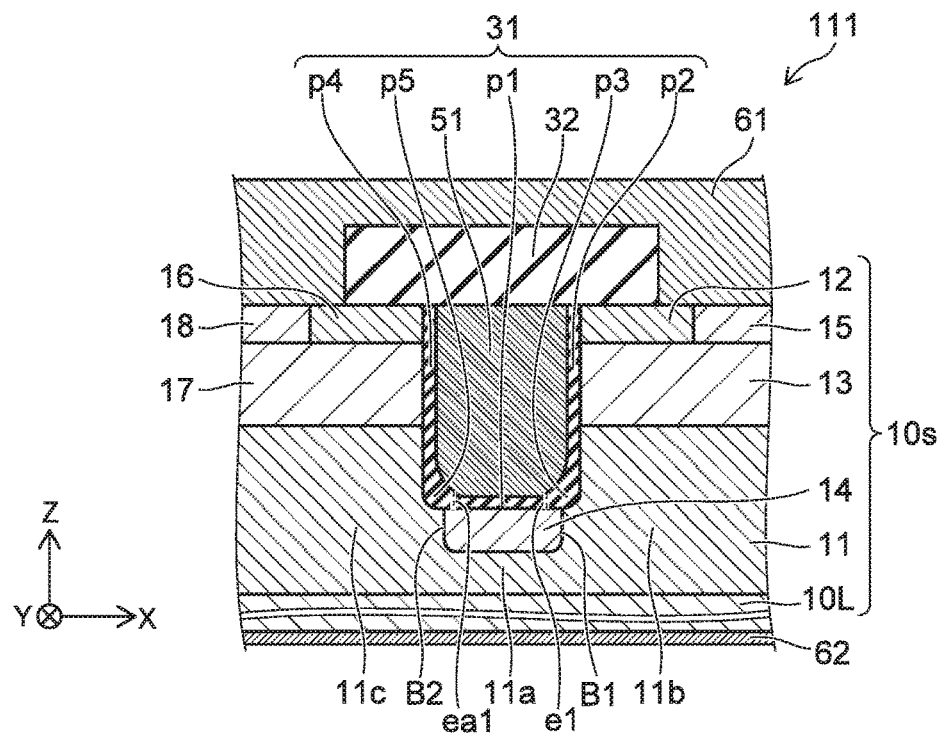
FIG. 9 is a schematic cross-sectional view illustrating another semiconductor device according to the first embodiment.
Figure 10:
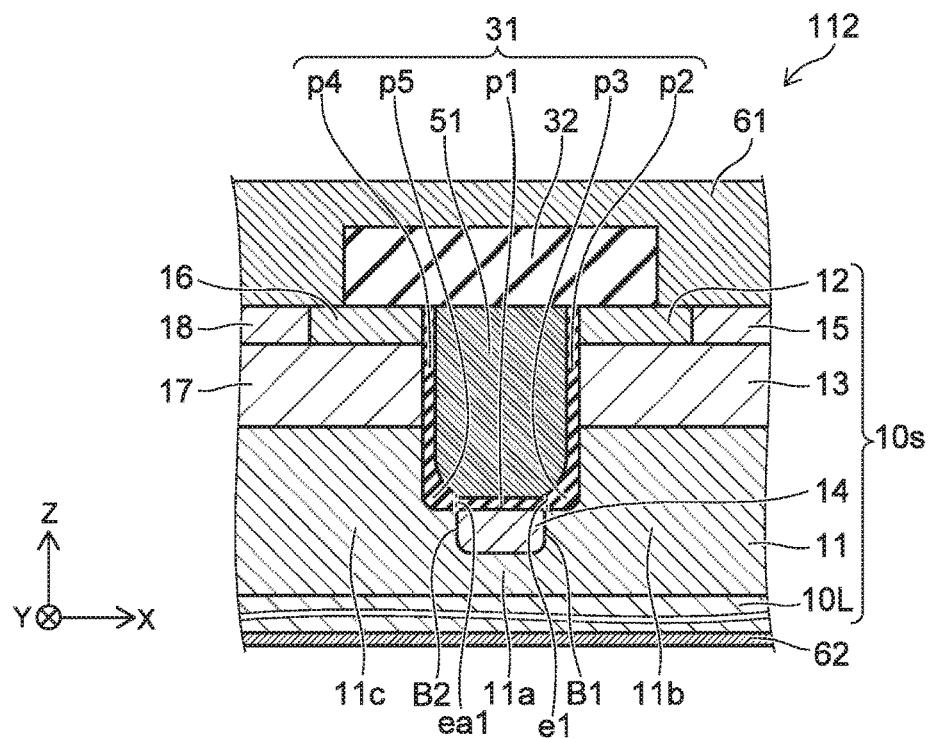
FIG. 10 is a schematic cross-sectional view illustrating another semiconductor device according to the first embodiment.
Figure 11:
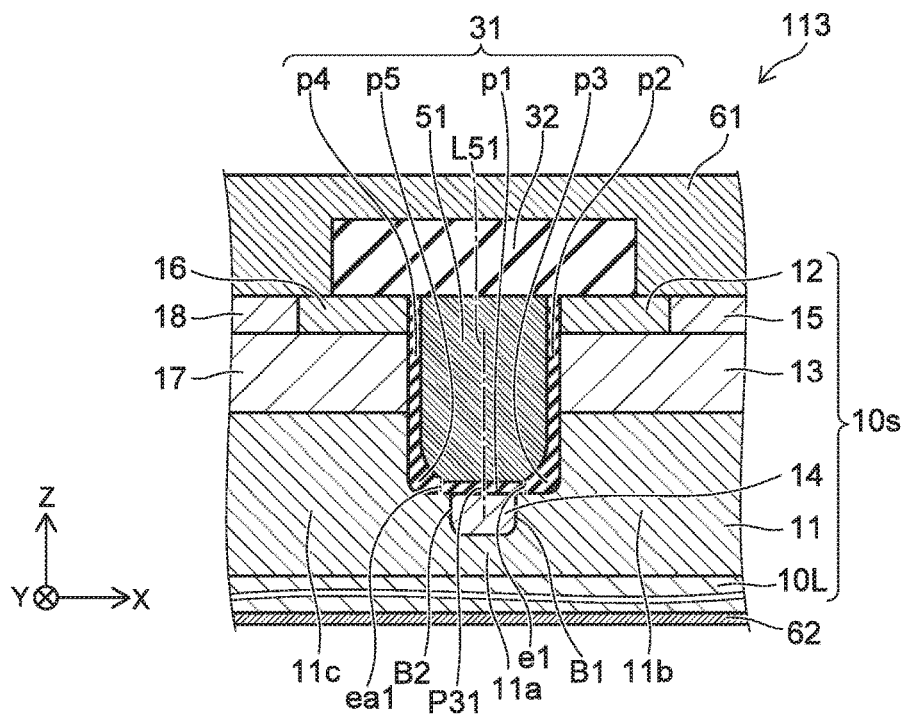
FIG. 11 is a schematic cross-sectional view illustrating another semiconductor device according to the first embodiment.

FIG. 9 to FIG. 11 are schematic cross-sectional views illustrating other semiconductor devices according to the first embodiment. As shown in FIG. 9 to FIG. 11, also, the first conductive portion 51, the semiconductor portion 10s, and the first insulating portion 31 are provided in the other semiconductor devices 111 to 113 according to the embodiment as well. The first electrode 61, the second electrode 62, and the second insulating portion 32 are provided in these examples as well. The first curvature radius R1 is larger than the second curvature radius R2 in the semiconductor devices 111 to 113 as well. A portion of the second partial region 11b overlaps the second portion p2 in the first direction (the Z-axis direction).

In the semiconductor device 111 as shown in FIG. 9, a portion of the second partial region 11b overlaps the first conductive portion 51 in the first direction (the Z-axis direction). The fourth semiconductor region 14 overlaps the first end portion e1 of the first portion p1 in the first direction (the Z-axis direction). In the semiconductor device 111, for example, the position along the X-axis direction of the boundary B1 is between the position along the X-axis direction of the first end portion e1 of the first portion p1 and the position along the X-axis direction of the interface between the second portion p2 and the first conductive portion 51. Otherwise, the configuration of the semiconductor device 111 is similar to, for example, the configuration of the semiconductor device 110. In the semiconductor device 111 as well, the electric field concentration is relaxed. A high breakdown voltage V1 is obtained. The maximum electric field intensity E1 can be suppressed.

In the semiconductor device 112 as shown in FIG. 10, the second partial region 11b overlaps the first end portion e1 of the first portion p1 in the first direction (the Z-axis direction). The position along the X-axis direction of the first end portion e1 is between the position along the X-axis direction of the boundary B1 and the position along the X-axis direction of the interface between the second portion p2 and the first conductive portion 51. Otherwise, the configuration of the semiconductor device 112 is similar to, for example, the configuration of the semiconductor device 110. In the semiconductor device 112 as well, the electric field concentration is relaxed. A high breakdown voltage V1 is obtained. The maximum electric field intensity E1 can be suppressed.

In the semiconductor device 113 as shown in FIG. 11, the position along the X-axis direction of the boundary B1 is between the position along the X-axis direction of the position P31 (the second position) and the position along the X-axis direction of the first end portion e1. Otherwise, the configuration of the semiconductor device 113 is similar to, for example, the configuration of the semiconductor device 110.

In the semiconductor device 113 as well, the electric field concentration is relaxed. A low on-resistance RonA is obtained.

Figure 12:
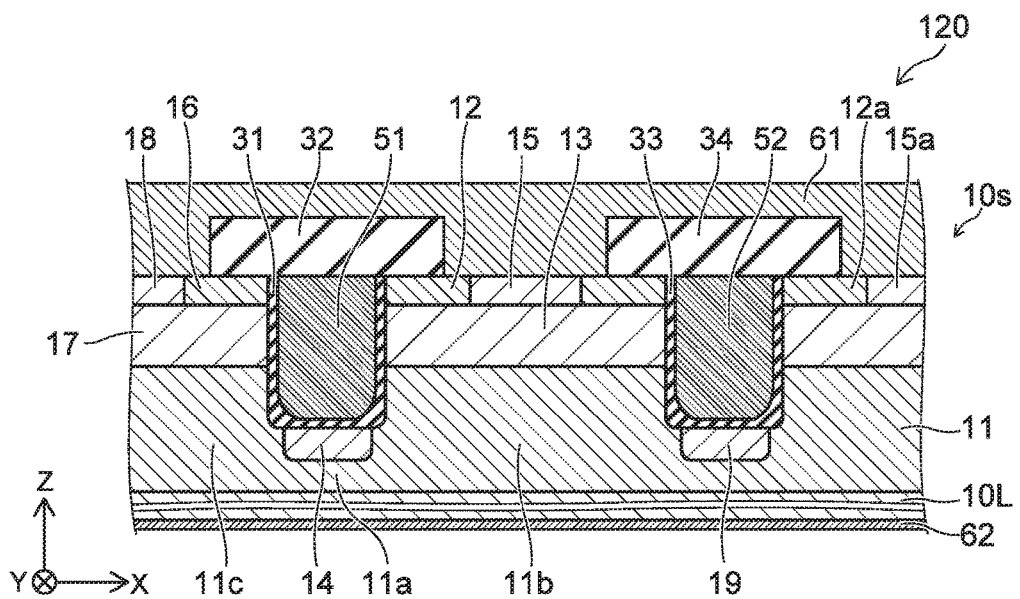
FIG. 12 is a schematic cross-sectional view illustrating another semiconductor device according to the first embodiment.

FIG. 12 is a schematic cross-sectional view illustrating another semiconductor device according to the first embodiment.

In the semiconductor device 120 according to the embodiment as shown in FIG. 12, a second conductive portion 52 and a third insulating portion 33 are provided in addition to the first conductive portion 51, the semiconductor portion 10s, the first insulating portion 31, the first electrode 61, the second electrode 62, and the second insulating portion 32. A fourth insulating portion 34 is further provided in the example.

The second semiconductor region 12 is positioned between the first conductive portion 51 and the second conductive portion 52 in the second direction (the X-axis direction). The fifth semiconductor region 15 is positioned between the second semiconductor region 12 and the second conductive portion 52 in the second direction (the X-axis direction). The third semiconductor region 13 is positioned between the first conductive portion 51 and the second conductive portion 52 in the second direction (the X-axis direction).

The third insulating portion 33 is provided between the semiconductor portion 10s and the second conductive portion 52. The first electrode 61 extends above the second conductive portion 52. The fourth insulating portion 34 is provided between the second conductive portion 52 and the first electrode 61 in the first direction (the Z-axis direction).

The semiconductor portion 10s further includes the ninth semiconductor region 19 of the second conductivity type. The ninth semiconductor region 19 is separated from the second conductive portion 52 in the first direction (the Z-axis direction). The second partial region 11b is positioned between the fourth semiconductor region 14 and the ninth semiconductor region 19 in the second direction (the X-axis direction).

The second conductive portion 52 may be electrically connected to the first conductive portion 51. Multiple gate electrodes (trench gate electrodes) are provided in the semiconductor device 120. In the semiconductor device 120 as well, the electric field concentration is relaxed. A high breakdown voltage V1 is obtained. The maximum electric field intensity E1 can be suppressed.

Second Embodiment

The embodiment relates to a method for manufacturing the semiconductor device 110. An example of the method for manufacturing the semiconductor device 110 will now be described.

FIG. 13A to FIG. 13F are schematic cross-sectional views illustrating the method for manufacturing the semiconductor device according to the second embodiment.

Figure 13A:
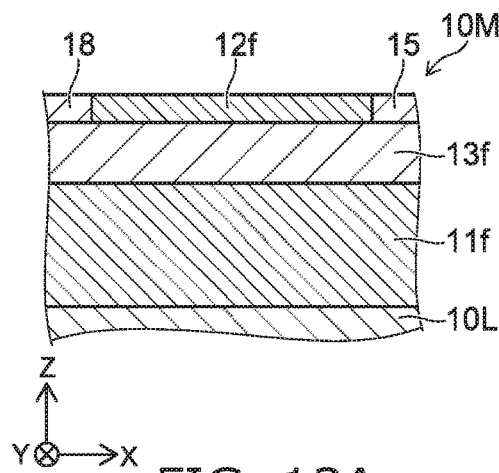
FIG. 13A to FIG. 13F are schematic cross-sectional views illustrating the method for manufacturing the semiconductor device according to the second embodiment.

A semiconductor member 10M is prepared as shown in FIG. 13A. The semiconductor member 10M includes silicon carbide. The semiconductor member 10M includes a first semiconductor film 11f, a second semiconductor film 12f, a third semiconductor film 13f, the fifth semiconductor region 15, and the eighth semiconductor region 18. The first semiconductor film 11f and the second semiconductor film 12f are of the first conductivity type. The third semiconductor film 13f is of the second conductivity type. For example, the first semiconductor film 11f is provided on the semiconductor layer 10L. The third semiconductor film 13f is provided on the first semiconductor film 11f. The second semiconductor film 12f, the fifth semiconductor region 15, and the eighth semiconductor region 18 are provided on the third semiconductor film 13f. The second semiconductor film 12f is positioned between the fifth semiconductor region 15 and the eighth semiconductor region 18 in the X-axis direction. The fifth semiconductor region 15 may be continuous with the eighth semiconductor region 18.

Figure 13D:
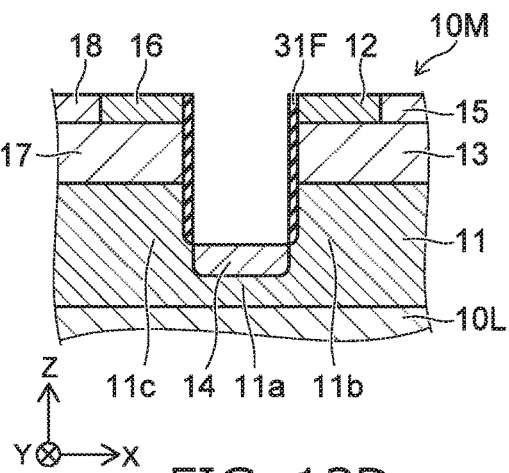
Figure 13B:
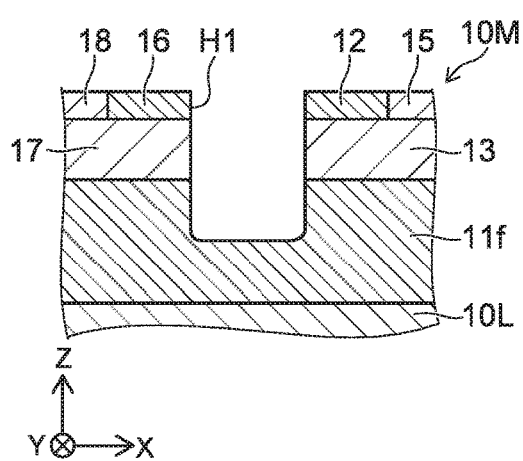

As shown in FIG. 13B, a hole H1 (e.g., a trench) is formed in the semiconductor member 10M. The hole H1 is formed by removing a portion of the second semiconductor film 12f, a portion of the third semiconductor film 13f, and a portion of the first semiconductor film 11f. The bottom portion of the hole H1 reaches the first semiconductor film 11f. The bottom portion of the hole H1 is positioned lower than the boundary between the first semiconductor film 11f and the third semiconductor film 13f. The second semiconductor region 12 and the sixth semiconductor region 16 are formed from the second semiconductor film 12f. The third semiconductor region 13 and the seventh semiconductor region 17 are formed from the third semiconductor film 13f.

Figure 13E:
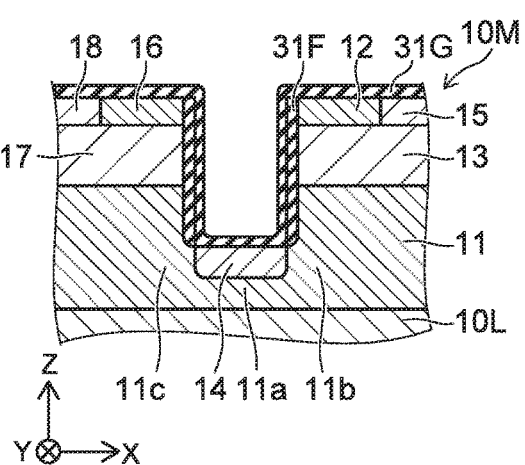
Figure 13C:
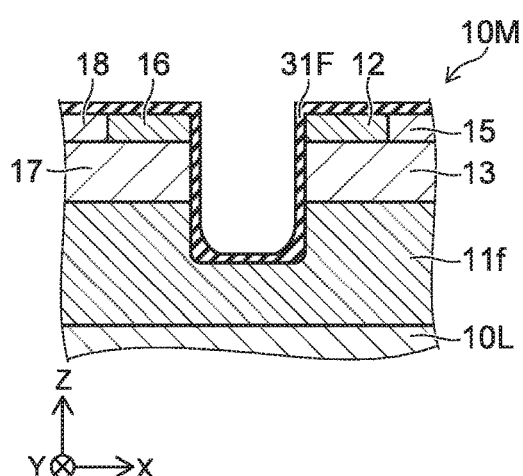

A first insulating film 31F is formed as shown in FIG. 13C. The first insulating film 31F is formed on the side surface of the hole H1, the bottom surface of the hole H1, and the upper surface of the semiconductor member 10M. The first insulating film 31F includes, for example, silicon oxide.

As shown in FIG. 13D, the thickness of the portion of the first insulating film 31F provided on the bottom surface of the hole H1 is reduced. For example, the reduction of the thickness is performed by anisotropic etching (e.g., dry etching (RIE) using $C_4F_8$ or the like, etc.). The thickness of the portion of the first insulating film 31F provided on the semiconductor member 10M may be reduced. The portion of the first insulating film 31F provided on the bottom surface of the hole H1 and the portion of the first insulating film 31F provided on the semiconductor member 10M may be removed. The portion of the first insulating film 31F provided on the side surface of the hole H1 remains.

As shown in FIG. 13D, the first semiconductor film 11f includes a portion positioned at the bottom surface of the hole H1. An impurity of the second conductivity type is introduced to the portion of the first semiconductor film 11f positioned at the bottom surface of the hole H1. For example, ion implantation is performed. Thereby, the fourth semiconductor region 14 is formed. The first to third partial regions 11a to 11c are formed from the first semiconductor film 11f. The first semiconductor region 11 is obtained.

A second insulating film 31G is formed as shown in FIG. 13E. The second insulating film 31G includes, for example, silicon oxide, etc.

Figure 13F:
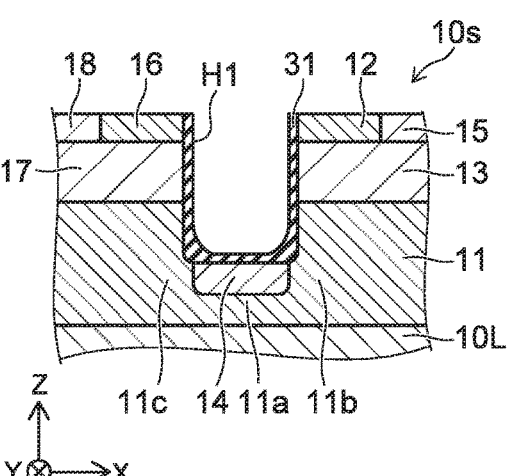

As shown in FIG. 13F, a portion of the second insulating film 31G is removed by isotropic etching (e.g., wet etching using HF, etc.). The remaining portion of the second insulating film 31G and the remaining first insulating film 31F become the first insulating portion 31. The curvature radius of the surface on the inside is larger than the curvature radius of the surface on the outside for the corner portion of the bottom portion of the first insulating portion 31. Thus, the semiconductor portion 10s is formed.

Subsequently, the first conductive portion 51 is formed by filling a conductive material into the remaining space of the hole H1. Subsequently, the second insulating portion 32, the first electrode 61, and the second electrode 62 are formed. Thereby, the semiconductor device 110 is obtained.

According to the manufacturing method recited above, a portion of the second partial region 11b overlaps the second portion p2 in the first direction (the Z-axis direction) (referring to FIG. 1B). The first curvature radius R1 is larger than the second curvature radius R2. A method for manufacturing a semiconductor device can be provided in which the breakdown voltage can be increased.

In the embodiment, at least one of the first conductive portion 51 or the second conductive portion 52 includes, for example, polysilicon. At least one of the first electrode 61, the second electrode 62, the conductive region 65a, or the conductive region 65b includes a metal such as aluminum, etc. At least one of the first to fourth insulating portions 31 to 34 includes a metal compound (silicon oxide, silicon nitride, aluminum oxide, etc.). In the embodiment, the materials recited above are examples; and various modifications are possible.

In the embodiment, the information that relates to the impurity concentration is obtained by, for example, SIMS (Secondary Ion Mass Spectrometry), etc. In the description recited above, the impurity concentration may be, for example, the carrier concentration.

In this specification, the "state of being electrically connected" includes the state in which multiple conductive bodies are physically in contact, and a current flows between the multiple conductive bodies. The "state of being electrically connected" includes the state in which another conductive body is inserted between multiple conductive bodies, and a current flows between the multiple conductive bodies.

According to the embodiments, a semiconductor device can be provided in which the on-resistance can be reduced.

In the specification of the application, "perpendicular" and "parallel" refer to not only strictly perpendicular and strictly parallel but also include, for example, the fluctuation due to manufacturing processes, etc. It is sufficient to be substantially perpendicular and substantially parallel.

Hereinabove, exemplary embodiments of the invention are described with reference to specific examples. However, the embodiments of the invention are not limited to these specific examples. For example, one skilled in the art may similarly practice the invention by appropriately selecting specific configurations of components included in semiconductor devices such as conductive portions, conductive regions, semiconductor regions, insulating portions, electrodes, etc., from known art. Such practice is included in the scope of the invention to the extent that similar effects thereto are obtained.

Further, any two or more components of the specific examples may be combined within the extent of technical feasibility and are included in the scope of the invention to the extent that the purport of the invention is included.

Moreover, all semiconductor devices practicable by an appropriate design modification by one skilled in the art based on the semiconductor devices described above as embodiments of the invention also are within the scope of the invention to the extent that the spirit of the invention is included.

Various other variations and modifications can be conceived by those skilled in the art within the spirit of the invention, and it is understood that such variations and modifications are also encompassed within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A semiconductor device, comprising:
a first conductive portion;
a semiconductor portion including silicon carbide; and
a first insulating portion,
the semiconductor portion including first to fourth semiconductor regions,
the first semiconductor region being of a first conductivity type, and including a first partial region and a second partial region, the first partial region being separated from the first conductive portion in a first direction, a direction from the first partial region toward the second partial region crossing the first direction,
the second semiconductor region being of the first conductivity type, a direction from a portion of the first conductive portion toward the second semiconductor region being aligned with a second direction crossing the first direction,
the third semiconductor region being of a second conductivity type and being provided between the second partial region and the second semiconductor region in the first direction,
the fourth semiconductor region being of the second conductivity type and being provided between the first conductive portion and the first partial region in the first direction, a direction from the fourth semiconductor region toward the second partial region being aligned with the second direction,
the first insulating portion including first to third portions,
at least a portion of the first portion being positioned between the first conductive portion and the fourth semiconductor region in the first direction,
the second portion being positioned between the second semiconductor region and the portion of the first conductive portion in the second direction and between the first conductive portion and the third semiconductor region in the second direction, a portion of the second partial region overlapping the second portion in the first direction,
the third portion being provided between the first portion and the second portion,
the third portion having a first surface and a second surface, the first surface opposing the first conductive portion, the second surface opposing the semiconductor portion,
a first curvature radius of the first surface in a cross section being larger than a second curvature radius of the second surface in the cross section, the cross section including the first direction and the second direction.

2. The device according to claim 1, wherein a portion of the fourth semiconductor region overlaps the second portion in the first direction.

3. The device according to claim 1, wherein the portion of the second partial region overlaps the first conductive portion in the first direction.

4. The device according to claim 1, wherein
the first conductive portion has two ends in the second direction,
a straight line along the first direction passes through a midpoint between the two ends and passes through a second position of the first portion,
a first end portion of the first portion is continuous with the third portion,
a length along the first direction of the first end portion is 1.1 times a first length along the first direction of the first portion at the second position, and
the portion of the second partial region overlaps the first end portion in the first direction.

5. The device according to claim 1, wherein
a length along the first direction of the third portion is longer than a length along the first direction of the first portion, and
a length along the second direction of the third portion is longer than a length along the second direction of the second portion.

6. The device according to claim 1, wherein the first curvature radius is not less than 4 times the second curvature radius.

7. The device according to claim 1, wherein a length along the first direction of the first portion is 0.25 µm or less.

8. The device according to claim 1, wherein a length along the first direction of the first portion is not more than 3 times a length along the second direction of the second portion.

9. The device according to claim 1, wherein the first conductive portion overlaps the first semiconductor region in the second direction.

10. The device according to claim 1, wherein an impurity concentration of the second conductivity type in the fourth semiconductor region is higher than an impurity concentration of the second conductivity type in the third semiconductor region.

11. The device according to claim 1, wherein an impurity concentration of the first conductivity type in the second semiconductor region is higher than an impurity concentration of the first conductivity type in the first semiconductor region.

12. The device according to claim 1, further comprising a first electrode electrically connected to the second semiconductor region,
the second semiconductor region being positioned between the third semiconductor region and at least a portion of the first electrode in the first direction.

13. The device according to claim 12, further comprising a second insulating portion,
the second insulating portion being positioned between the first conductive portion and another portion of the first electrode in the first direction.

14. The device according to claim 12, wherein
the semiconductor portion further includes a fifth semiconductor region of the second conductivity type,
the second semiconductor region is positioned between the fifth semiconductor region and the portion of the first conductive portion in the second direction, and
the first electrode is electrically connected to the fifth semiconductor region.

15. The device according to claim 12, wherein
the first semiconductor region further includes a third partial region,
the fourth semiconductor region is positioned between the third partial region and the second partial region in the second direction, the semiconductor portion further includes a sixth semiconductor region and a seventh semiconductor region, the sixth semiconductor region is of the first conductivity type, the first conductive portion is positioned between the sixth semiconductor region and the second semiconductor region in the second direction, the seventh semiconductor region is of the second conductivity type, the first conductive portion is positioned between the seventh semiconductor region and the third semiconductor region in the second direction, the seventh semiconductor region is positioned between the third partial region and the sixth semiconductor region in the first direction, the first insulating portion further includes a fourth portion and a fifth portion, the fourth portion is positioned between the first conductive portion and the sixth semiconductor region in the second direction and between the first conductive portion and the seventh semiconductor region in the second direction, a portion of the third partial region overlaps the fourth portion in the first direction, the fifth portion is provided between the first portion and the fourth portion, the fifth portion has a third surface and a fourth surface, the third surface opposing the first conductive portion, the fourth surface opposing the semiconductor portion, and a third curvature radius of the third surface in the cross section is larger than a fourth curvature radius of the fourth surface in the cross section.

16. The device according to claim 15, wherein the semiconductor portion further includes an eighth semiconductor region of the second conductivity type, the sixth semiconductor region is positioned between the first conductive portion and the eighth semiconductor region in the second direction, and the first electrode is electrically connected to the eighth semiconductor region.

17. The device according to claim 1, further comprising:
a second conductive portion;
a third insulating portion; and
a fourth insulating portion, the second semiconductor region being positioned between the first conductive portion and the second conductive portion in the second direction, the third semiconductor region being positioned between the first conductive portion and the second conductive portion in the second direction, the third insulating portion being provided between the semiconductor portion and the second conductive portion, the semiconductor portion further including a ninth semiconductor region of the second conductivity type, the ninth semiconductor region being separated from the second conductive portion in the first direction, the second partial region being positioned between the fourth semiconductor region and the ninth semiconductor region in the second direction.

18. The device according to claim 1, further comprising a conductive region electrically connected to the second semiconductor region, the semiconductor portion further including a ninth semiconductor region of the second conductivity type, the conductive region being electrically connected to the ninth semiconductor region, the second partial region being positioned between the fourth semiconductor region and the ninth semiconductor region in the second direction.

19. The device according to claim 1, further comprising a second electrode, the first partial region being positioned between the fourth semiconductor region and the second electrode in the first direction, the second partial region being positioned between the third semiconductor region and the second electrode in the first direction.

20. The device according to claim 19, wherein the semiconductor portion further includes a semiconductor layer of the first conductivity type or the second conductivity type, and the semiconductor layer is positioned between the first semiconductor region and the second electrode.

* * * * *